United States Patent
Hirano et al.

(10) Patent No.: US 9,116,173 B2
(45) Date of Patent: Aug. 25, 2015

(54) CONTACT PROBE HAVING CARBON FILM ON SURFACE THEREOF

(75) Inventors: Takayuki Hirano, Kobe (JP); Takashi Kobori, Kobe (JP)

(73) Assignees: Kobe Steel, Ltd., Kobe-shi (JP); KOBELCO RESEARCH INSTITUTE, INC., Kobe-shi (JP)

( * ) Notice: Subject to any disclaimer, the term of this patent is extended or adjusted under 35 U.S.C. 154(b) by 236 days.

(21) Appl. No.: 13/697,248

(22) PCT Filed: May 10, 2011

(86) PCT No.: PCT/JP2011/060782
§ 371 (c)(1),
(2), (4) Date: Nov. 9, 2012

(87) PCT Pub. No.: WO2011/142366
PCT Pub. Date: Nov. 17, 2011

(65) Prior Publication Data
US 2013/0049784 A1 Feb. 28, 2013

(30) Foreign Application Priority Data
May 10, 2010 (JP) .................... 2010-108504

(51) Int. Cl.
*G01R 31/00* (2006.01)
*G01R 1/067* (2006.01)
(Continued)

(52) U.S. Cl.
CPC .............. *G01R 1/06761* (2013.01); *G01R 3/00* (2013.01); *G01R 35/00* (2013.01)

(58) Field of Classification Search
CPC ............... H01L 51/0048; H01L 21/02126; G01N 27/3335; G01N 27/49; A61M 5/007; G01R 1/067; G01R 1/06755; G01R 31/04; G01R 1/07342; G01R 1/06738; G01R 1/06761; G01R 1/0466; G01R 1/06727; G01R 1/06733; G01R 1/0735; G01R 1/07357; G01R 1/06716; G01R 1/06722; G01R 1/06744; G01R 1/073; G01R 35/00; G01R 3/00; H01R 13/02–13/35
See application file for complete search history.

(56) References Cited

U.S. PATENT DOCUMENTS 5,010,249 A * 4/1991 Nishikawa ............... 216/11
5,763,879 A * 6/1998 Zimmer et al. ........... 850/3

(Continued)

FOREIGN PATENT DOCUMENTS

JP  10 226874    8/1998
JP  2001 289874  10/2001

(Continued)

OTHER PUBLICATIONS

Japanese Office Action issued on Jul. 5, 2012, in patent Application No. 2011-104394 with English translation.

(Continued)

*Primary Examiner* — Vinh Nguyen
(74) *Attorney, Agent, or Firm* — Oblon, McClelland, Maier & Neustadt, L.L.P.

(57) ABSTRACT

A contact probe includes a base material, a carbon film provided on a tip of the contact probe and configured to contact with an electrode, and an intermediate layer provided between the carbon film and the base material. The carbon film includes a metal element. A concentration of the metal element in the carbon film surface is lower than an average concentration of the metal element in a whole of the carbon film. The carbon film further includes: a plurality of layers, each of the plurality of layers having a uniform concentration of the metal element along a direction of a thickness of the carbon film; a layer in which the concentration of the metal element is continuously changed along a direction of a thickness of the carbon film; or both thereof.

13 Claims, 4 Drawing Sheets

(51) Int. Cl.
    *G01R 35/00* (2006.01)
    *G01R 3/00* (2006.01)

(56) References Cited

U.S. PATENT DOCUMENTS

| | | | |
|---|---|---|---|
| 6,013,169 | A | 1/2000 | Okubo et al. |
| 6,784,680 | B2 | 8/2004 | Haga et al. |
| 6,815,962 | B2 * | 11/2004 | Hirano et al. ............ 324/756.02 |
| 7,281,955 | B2 * | 10/2007 | Ceron et al. ................ 439/668 |
| 7,934,962 | B2 * | 5/2011 | Hirano et al. ................ 439/886 |
| 2002/0000821 | A1 | 1/2002 | Haga et al. |
| 2003/0087096 | A1 | 5/2003 | Sato et al. |
| 2005/0181226 | A1 | 8/2005 | Weidman et al. |
| 2006/0040105 | A1 | 2/2006 | Sato et al. |
| 2006/0059688 | A1 * | 3/2006 | Tseng et al. ............... 29/898.02 |
| 2009/0188696 | A1 | 7/2009 | Uno et al. |
| 2009/0243637 | A1 * | 10/2009 | Okai et al. .................... 324/724 |
| 2010/0190390 | A1 | 7/2010 | Yoshida et al. |
| 2011/0214900 | A1 | 9/2011 | Hirano et al. |
| 2013/0049784 | A1 | 2/2013 | Hirano et al. |
| 2013/0222005 | A1 * | 8/2013 | Hirano et al. ............ 324/755.01 |

FOREIGN PATENT DOCUMENTS

| | | |
|---|---|---|
| JP | 2001 343397 | 12/2001 |
| JP | 2002 318247 | 10/2002 |
| JP | 2003 231203 | 8/2003 |
| JP | 2006 216929 | 8/2006 |
| JP | 2007 24613 | 2/2007 |
| JP | 2007 519829 | 7/2007 |
| JP | 2008 282802 | 11/2008 |
| JP | 2011-257385 A | 12/2011 |
| TW | 440693 | 6/2001 |

OTHER PUBLICATIONS

Japanese Office Action issued on Nov. 8, 2012, in patent Application No. 2011-104394 with English translation.

International Search Report Issued Jul. 12, 2011 in PCT/JP11/60782 Filed May 10, 2011.

* cited by examiner

(a) CURVATURE RADIUS ~13μm (b) CURVATURE RADIUS ~9μm

CONTACT PROBE HAVING CARBON FILM ON SURFACE THEREOF

TECHNICAL FIELD

The present invention relates to a contact probe used in the test of electrical properties through contact with an electrode of a semiconductor element, and particularly, the present invention relates to a contact probe in which conductivity does not deteriorate with repeated tests, and a connection device for test including the contact probe, such as a socket for test, a probe card and a testing unit.

BACKGROUND ART

Electrical properties of electronic parts such as integrated circuits (ICs), large-scale integrated circuits (LSIs) and light-emitting diodes (LEDs) (in other words, electronic parts using semiconductor elements) are tested by bringing a contact probe into contact with an electrode of a semiconductor element. Such a contact probe used in the test device not only has low conductivity, that is, a low contact resistance value but also is required to have conductivity without deteriorating even with repeated contact with an electrode that is an adherend.

A contact resistance value of a contact probe is generally set to 100 m$\Omega$ or less, but sometimes deteriorates to several hundred m$\Omega$ to several $\Omega$ by repeated tests with the adherend. As a countermeasure thereto, cleaning or replacement of a contact probe has been carried out. However, such a countermeasure significantly lowers the reliability of a test process and an operating rate of a test device, and therefore, it has been desired to realize a contact probe having a property that contact resistance value does not deteriorate even when in use for a long period of time. Particularly, when solder, tin, or the like is formed on an electrode that is an adherend, since the surface thereof is easily oxidized and soft, the surface is scraped off by contact of the contact probe, thereby generating a property of easily adhering to the tip part of the contact probe and causing stable contact to be difficult.

For example, Patent Document 1 discloses a hard carbon film formed of carbon or carbon and hydrogen and the electrical resistivity of which is altered in the thickness direction in order to improve the adhesiveness between the hard carbon film and the base material, as the hard carbon film which can be applied to coating with mold releasability or the like for preventing adhesion of a soft metal such as solder or Al. However, Patent Document 1 does not mention application to a contact probe or indicate any consideration on conductivity.

As a technology for stabilizing contact resistance value of the contact probe, for example, Patent Documents 2 to 5 can be exemplified. Patent Documents 2 to 5 disclose that a carbon film such as DLC (Diamond Like Carbon) formed on the surface of a contact terminal with an electrode of a semiconductor element is made to contain a metal element such as tungsten, thereby realizing a surface film having both of a low adhesion property to other material(s) and high conductivity resulting from the contained metal.

PRIOR ART DOCUMENTS

Patent Documents

Patent Document 1: JP-A-10-226874
Patent Document 2: JP-A-2002-318247
Patent Document 3: JP-A-2003-231203
Patent Document 4: JP-A-2007-24613
Patent Document 5: JP-A-2001-289874

SUMMARY OF THE INVENTION

Problems That the Invention is to Solve

An object of the present invention is to provide a contact probe that can realize low adhesion property to an adherend (for example, solder, Sn, Al, Pd, or the like) and maintain stable conductivity (evaluated by contact resistance value in the present invention) over a long period of time, and a connector containing the contact probe.

Means for Solving the Problems

The present invention provides the following contact probe and connection device for test.

(1) A contact probe which repeatedly contacts with an electrode,
wherein a carbon film comprising a metal element is formed on a surface of the contact probe which contacts with the electrode, and
a concentration of the metal element in the carbon film surface is lower than an average concentration thereof in a whole of the carbon film.

(2) The contact probe according to (1), wherein the carbon film has a multilayer structure of the concentration of the metal element, or the concentration of the metal element is continuously changed toward the thickness direction of the film.

(3) The contact probe according to (2), wherein the concentration of the metal element is continuously decreased from a base material side of the contact probe to a surface side thereof.

(4) The contact probe according to any one of (1) to (3), wherein the concentration of the metal element in the carbon film surface is 15 atomic % or less.

(5) The contact probe according to any one of (1) to (4), wherein a difference in concentration of the metal element between the surface concentration and the average concentration is 10 atomic % or more.

(6) The contact probe according to any one of (1) to (5), wherein the average concentration of the metal element in the whole of the carbon film is more than 15 atomic %.

(7) The contact probe according to any one of (1) to (6), wherein the carbon film is a diamond-like carbon film.

(8) The contact probe according to any one of (1) to (7), wherein the metal element is at least one kind selected from the group consisting of tungsten, tantalum, molybdenum, niobium, titanium and chromium.

(9) The contact probe according to any one of (1) to (8), wherein a total thickness of the carbon film is 50 nm or more and 5 $\mu$m or less.

(10) The contact probe according to any one of (1) to (9), wherein a projection is formed at a tip of the contact probe, and when a tip of the projection is projected from a side surface of the contact probe, a radius of curvature thereof is 10 $\mu$m or less.

(11) A connection device for test, which comprises a plurality of the contact probes according to any one of (1) to (10).

Advantageous Effects of the Invention

With regard to the concentration of a metal element in a carbon film formed on the surface of a contact probe contacting with an electrode, since the concentration in the film surface is lower than the average concentration thereof, a contact probe of the present invention can prevent deterioration of conductivity resulting from oxidization of the metal element. Furthermore, by securing the average concentration in the whole of the film to a predetermined level or higher, both of the conductivity of the contact probe and low adhesion property of the contact probe to an adherend (particularly, Sn included in the adherend) can be realized.

BRIEF DESCRIPTION OF THE DRAWINGS

FIGS. 4(*a*) and (*b*) are SEM (Scanning Electron Microscope) photographs in which the tip of a contact probe is enlarged; and FIG. 4(*a*) is an SEM photograph in the case where the curvature radius of the tip is 13 µm, and FIG. 4(*b*) is an SEM photograph in the case where the curvature radius of the tip is 9 µm.

EMBODIMENTS FOR CARRYING OUT THE INVENTION

The present inventors have studied the technology disclosed in the above-described Patent Documents 2 to 5, and it was found that they showed deterioration of conductivity due to the use over a long period of time, that is, a still high rate of increase of contact resistance values. The present inventors have studied the cause thereof, and it was thought that the contact resistance value of the contact probe increases because a metal element and a carbide thereof included in the carbon film formed on the surface of the contact probe is oxidized due to the influence of moisture (humidity) or temperature of surroundings. In more detail, in Patent Documents 2 to 5, molybdenum, tungsten, tantalum, and the like are exemplified as metal elements contained in the carbon film, but it is thought that oxides of the metal elements are insulators or semiconductors, and the formation of oxides of the metals has a negative influence on contact resistance values of the contact probe. In addition, according to the study of the present inventors, it was found that oxidation advances even when the metal elements are in a carbide state, the contact resistance of the contact probe increases due to the formation of oxides on the surface, and a high contact resistance of several Ω is sometimes shown depending on conditions. Particularly, in the test of semiconductors, test is performed at high temperatures of about 120 to 160° C., but in such a case, if a carbon film containing the metal elements or carbides thereof is contacted with an electrode of the semiconductor or the like, oxides thereof are formed more quickly and contact resistance of the contact probe increases. There is a case where such a oxide film is removed by the friction resulting from repeated contact with the electrode of the semiconductor or the like, but when the oxide film is not removed and remains, unsatisfactory contact with the electrode occurs, and it is important to suppress the formation of oxides to the maximum extent in order to secure stable conductivity of the contact probe at all times. As a result of performing further study on the formation of the oxides, it was found that an increase in contact resistance due to oxides of the metal elements or carbides thereof is significantly influenced by the concentration of metal elements in the carbon film surface, and a contact resistance value increases after the passage of a certain period of time since the oxides are formed due to influence of moisture and the like of surroundings.

On the other hand, the conductivity of the carbon film depends on the concentration of metal elements or the like contained in the carbon film, and when the concentration of metal elements or the like is low, it is not possible to sufficiently secure the conductivity of the carbon film.

In order to suppress the oxidation of the metal elements to prevent increase in contact resistance of the contact probe after the passage of a certain period of time and also lower contact resistance in the initial stage of use, it was found that it is favorable to lower the concentration of the metal elements contained in the carbon film in the vicinity of the surface of the carbon film and increase the concentration thereof in the other parts. Details thereof will be provided below.

The carbon film of the invention is formed on the surface of a contact probe that contacts with an electrode, and contains a metal element. In the present invention, it is important that the concentration of the metal element is lower than the average concentration thereof in the whole of the carbon film. That is, the carbon film formed on the surface of the contact probe of the present invention is characterized by including an area in the carbon film surface, in which the concentration of the metal element is lower than the average concentration thereof in the whole of the carbon film. By providing the area in which the concentration of the metal element is controlled to be low in the carbon film surface, the metal element is inhibited from the oxidation due to the influence of moisture (humidity) or temperature of surrounding environment. As a result, the increase of the contact resistance value of the contact probe can be inhibited even after the passage of a certain period of time after the repeated test.

The metal element may present in the form of a metal or in the form of a carbide of the metal element in the carbon film. Even in the case where the metal element presents in the form of the carbide, the concentration thereof is represented as the concentration of the metal element. For example, in the case of the carbide such as WC, it is represented as the concentration (atomic %) of W element.

In the present invention, the "carbon film surface" means an area on the surface side where the concentration of the metal element is lower than the average concentration thereof in the whole of the carbon film. Thus, all of the areas on the carbon film surface side where the concentration of the metal element is satisfied with the above relation are included in the meaning of the carbon film surface in the present invention. Specifically, the "carbon film surface" may be, for example, an area with the depth of about 1 to 3 nm from the outermost surface of the carbon film or an area with the depth of 5 nm from the outermost surface of the carbon film, as long as the concentration of the metal element satisfies the above relation. It is preferable that, in order to effectively suppress the influence of oxidation resulting from surrounding environment, the concentration in the area (corresponding to the "carbon film surface") from the outermost surface of the carbon film to a depth of at least about 20 nm is lower than the average concentration thereof in the whole of the carbon film.

In order to effectively exhibit the action (to suppress the oxidation of the metal element to inhibit the increase of the contact resistance of the contact probe) caused by the formation of the carbon film surface, the concentration of the metal element in the carbon film surface is preferably 15 atomic % or less. The preliminary experiment to lead the upper limit (15 atomic % or less) is explained by referring to FIG. 1. The following preliminary experiment (including FIG. 2 described later) shows the result in the case of using W (tungsten) as the metal element, but the metal element is not limited to W, and it was confirmed by experiments that almost the same result was shown in the case of using other preferable metal elements (tantalum, molybdenum, niobium, titanium and chromium) or a mixture including two or more of the meta elements including W which can be used in the present invention.

Figure 1:
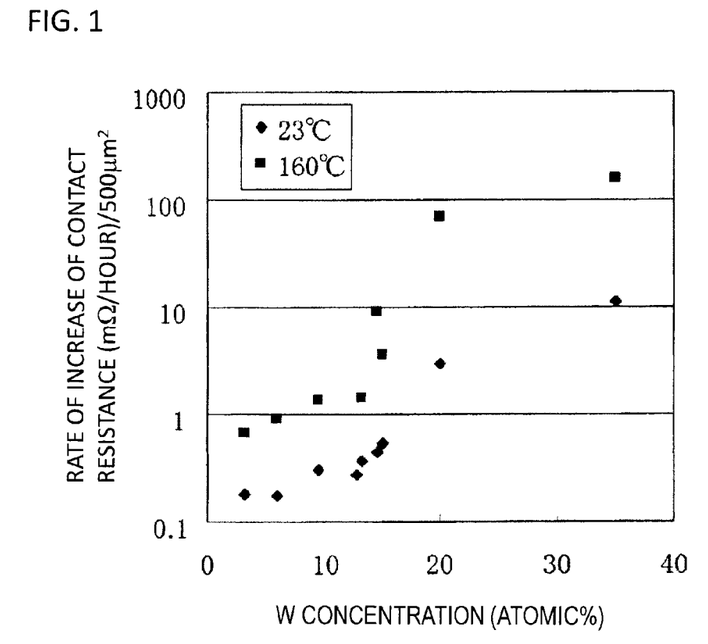
FIG. 1 is a graph showing the relationship between W (tungsten) concentration in a carbon film (DLC film) and a rate of increase of the contact resistance.

FIG. 1 shows the result of the preliminary experiment performed in order to find out the influence of the concentration of metal elements in the carbon film on the oxidation of the surface, and in more detail, FIG. 1 is a graph showing the relationship between the concentration of W (tungsten) in the carbon film (DLC film) and the rate of increase of the contact resistance of the DLC film in the case of the measurement sample prepared below. First, partial masking was performed on an Au electrode, and a carbon film (DLC film) was formed in the same manner as the Examples to be described later. When the DLC film was formed, W chips were arranged on a carbon target so that W (tungsten) is contained in the DLC film, and the W concentration in the DLC film was controlled by adjusting the number of the chips. After that, the masking was removed and the Au electrode in the part which had been subjected to masking was exposed, thereby preparing a sample. By bringing the Au contact probe which is composed of the metal material same as the electrode into contact with the measurement sample prepared as described above (in detail, each of the exposed Au electrode part and the DLC film part), the contact resistance of the measurement sample was measured. When the Au electrode is brought into contact with the Au contact probe, the contact resistance can be ignored overall, and resistance of the probe and wiring is constant, and accordingly, it is possible to calculate the contact resistance on the surface of the DLC film constituting the measurement sample by subtracting these values measured in advance from the contact resistance of the measurement sample. The measurement was performed during a certain time before and after the pin was left. The measurement was performed at each of 23° C. and 160° C. with regard to the temperature of the environment where the pin is left, and the result is shown in FIG. 1. From FIG. 1, it was found that the rate of increase of contact resistance sharply increases at the both temperatures if the W concentration is 15 atomic % or more.

Based on the above experiment result of FIG. 1, the preferable concentration (indicated by the total concentration in the case of two or more kinds of metal elements) of the metal element in the carbon film surface, which is effective for the suppression of the oxidation of the metal element, is set to 15 atomic % or less. A concentration of 10 atomic % or less is more preferable, and a concentration of 8 atomic % or less is further preferable. The lower limit of the concentration thereof in the carbon film surface is not particularly limited from the standpoint of the rate of increase of the contact resistance, and it is preferably about 1 atomic % or more from the standpoint of sufficiently securing the conductivity of the carbon film.

On the other hand, since the conductivity of the carbon film is satisfactory in proportion to the concentration of the metal elements contained in the carbon film (in other words, contact resistance values are decreased), it is effective to secure the average concentration of the metal elements in the whole of the carbon film to a predetermined level or more.

Figure 2:
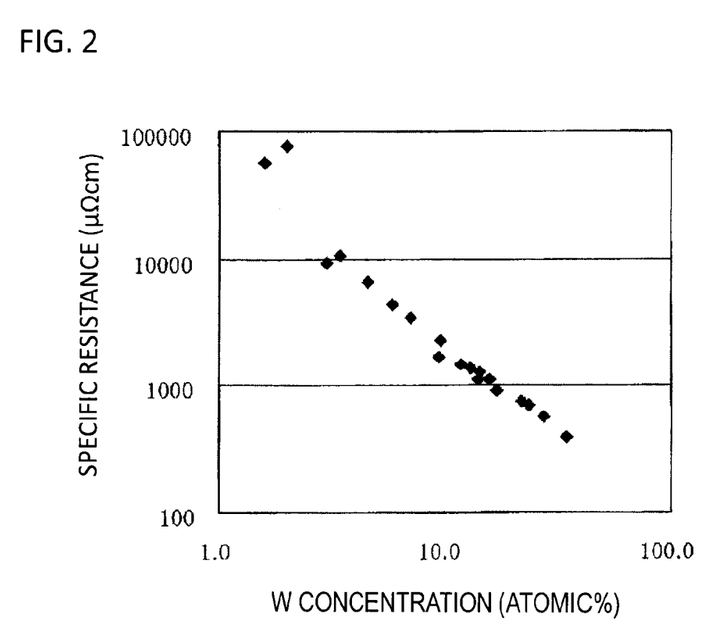
FIG. 2 is a graph showing the relationship between W (tungsten) concentration in a carbon film (DLC film) and a specific resistance.

FIG. 2 shows the result of a preliminary experiment performed in order to find out the influence of the concentration of the metal elements in the carbon film oo the conductivity, and in more detail, FIG. 2 is a graph showing the relationship between W (tungsten) concentration in the carbon film (DLC film) and the specific resistance of the DLC film in the case of the measurement sample prepared below. First, a measurement sample in which a carbon film (DLC film) containing W (tungsten) was formed on an insulating substrate (obtained by forming 100 nm of a thermally-oxidized film on a silicon substrate) in the same manner as the Examples to be described later was prepared, sheet resistance was measured by the four-probe method, and the specific resistance of the DLC film containing W was calculated based on the cross-sectional area and thickness of the DLC film. The specific resistance of the DLC film in the case where the W concentration is changed variously was measured, and the result is shown in FIG. 2. As a result, it was found that the specific resistance is in almost inverse proportion to the W concentration in the DLC film, and the specific resistance decreases as the W concentration increases. For example, when the W concentration is 10 atomic %, the specific resistance is about 2000 $\mu\Omega\cdot$cm (for example, which is about 1000 times the specific resistance of a metal such as gold), and if the thickness and contact area of the DLC film is set to about, for example, 1 $\mu$m and 200 $\mu$m$^2$, respectively, the resistance of the DLC film is about 100 m$\Omega$. On the other hand, the W concentration raises to about 15 atomic %, the specific resistance is about 1200 $\mu\Omega\cdot$cm, and therefore, it is possible to obtain the resistance value of about 60 m$\Omega$ in the same thickness and contact area as described above, and if the W concentration raises to 35 atomic %, it is possible to obtain the resistance value of 20 m$\Omega$.

Therefore, the average concentration (indicated by the total concentration in the case of two or more kinds of metal elements) of the metal elements in the whole of the carbon film is preferably more than 15 atomic %, and more preferably 20 atomic % or more. In addition, by increasing the average concentration in the whole of the film raised to a predetermined level or more, it is advantageous that the film is hardly peeled off due to improved adhesiveness of the carbon film with the base material and reduced film stress. On the other hand, when the average concentration in the whole of the carbon film is excessively high, the properties as a metal are intensified, and it is difficult to obtain a flat and smooth surface resulting from homogeneous amorphous such as DLC which is suitably used as the carbon film. Furthermore, the difference in mechanical properties from the film surface part becomes easily excessively high and peeling-off easily occurs, and design of the entire carbon film is difficult. Thus, the average concentration of the metal element in the whole of the carbon film (concentration of the metal element in all areas where the carbon film includes the metal element) is preferably 95 atomic % or less, more preferably 90 atomic % or less, and further more preferably 70 atomic % or less. Moreover, with regard to the metal element, a difference between the surface concentration and average concentration is preferably about 10 atomic % or more, and more preferably 15 atomic % or more. In this manner, it is possible to effectively exhibit the effect that the initial contact resistance value immediately after beginning of use can be suppressed to be low, and an increase in contact resistance values can be suppressed after repeated tests are performed and a certain period of time passes.

The structure of the carbon film may be a multilayer (that is, two layers or more) structure for the concentration of the metal elements, or may be a structure where the concentration continuously changes in the thickness direction of the film. The kind (the kind of preferable metal elements is described later) of the metal elements contained in each layer may be the same or different.

When the carbon film of the present invention has a multilayer structure for the concentration of the metal elements, the metal elements in each layer may have uniform concentration in the thickness direction of the film, and may have a concentration which is continuously changed toward the thickness direction of the film.

In the case where the carbon film has the multilayer structure or where the concentration of the metal element is continuously changed toward the thickness direction of the film, as long as the surface concentration of the metal elements is lower than the average concentration in the whole of the film, the concentration distribution of the metal element in the thickness direction of the film may be continuously decreased from the base material side of the contact probe toward the surface side, and increase and decrease of the concentration may be alternately repeated. However, it is preferable that the concentration is continuously decreased from the base material side of the contact probe toward the surface side in terms of suppression of oxidization of the metal element and low resistance of the entire film. When the carbon film has the multilayer structure and the layers are set to be a first layer, a second layer, a third layer, . . . , the outermost layer in this order from the base material side, continuous decrease of the concentration of the metal elements from the base material side toward the surface side may satisfy the relationship of (the concentration in the first layer)>(the concentration in the second layer)>(the concentration in the third layer)> . . . >(the concentration in the outermost layer).

In the present invention, when the concentration of the metal elements is continuously changed toward the thickness direction of the film, the average concentration of the metal elements in the whole of the carbon film can be obtained by calculating the integrated concentration of the metal elements over the overall thickness of the carbon film and dividing the integrated concentration by the overall thickness of the carbon film. In addition, when the carbon film has the multilayer structure, the average concentration can be obtained such that the value of (the concentration in each layer)×(the thickness of each layer) is calculated for all layers to obtain the sum and the sum is divided by the overall thickness of the carbon film. Furthermore, when the concentration in each layer is continuously changed in the multilayer structure, the average concentration is obtained in the same manner as described above to be set as the concentration in each layer.

In the present invention, the analysis of the metal element in the thickness direction (direction from the base material side toward the surface side) of the carbon film was performed by Auger electron spectroscopy. The analysis of the metal element in the thickness direction of the carbon film can be performed by XPS analysis method, but by using Auger electron spectroscopy, since beam can be narrowed down to the level of several microns, in particular, the analysis of the base material including a fine tip such as contact probes can be performed more precisely.

As the above-described metal element included in the carbon film, one or more kinds selected from the group consisting of tungsten, tantalum, molybdenum, niobium, titanium, and chrome are preferable. These elements are preferable in that they are metals that easily form carbides thereof, uniformly disperse in a carbon film, and can keep a uniform amorphous state. Among the above-described elements, tungsten is preferably used in that it is available at a low cost and carbides thereof are stable. The metal element may be included solely, or in combination of two or more kinds thereof. In addition, the metal element included in the carbon film surface may be the same as the metal element included in the carbon film excluding the surface thereof as show in the Example 1 described later, or different from each other as shown in the Example 4 described later.

The carbon film of the present invention which has high hardness and excellent abrasion resistance and slidability and is amorphous over the entire film is preferable as represented by, for example, a DLC film. The reason is that such a carbon film is not attrited with repeated contact with other material(s) without adhesion of other materials, and since the carbon surface is in an amorphous state, the carbon film has a low possibility of increasing unevenness on the surface. In addition, if the thickness of the carbon film is excessively thin, there is a concern that the mechanical strength is insufficient and abrasion and cracking are caused, and if the thickness is excessively thick, there is a concern that conductivity is decreased. Therefore, the thickness of the entire carbon film is preferably 50 nm or more and 5 μm or less, and more preferably 100 nm or more and 2 μm or less. Arbitrary combinations of the upper limit and lower limit of the thickness can be set as the range of the thickness.

Such a carbon film (further, an intermediate layer described later) including the layer structure can be formed by various film-forming method such as chemical vapor deposition method (CVD method), sputtering method and arc ion plating method (AIP method), and the sputtering method or AIP method is preferably applied since a carbon film having low electrical resistance can be easily formed or a metal element can be easily introduced into the carbon film. In particular, the sputtering method is the most preferable method since a carbon film with high quality is formed. That is, the diamond structure and graphite structure are exemplified from the property that the carbon film originally has, and the amorphous structure which is the intermediate structure between them is preferable for the purpose of obtaining the sufficient hardness and low electrical conductivity. Such a structure can be much easily obtained by the sputtering method, and there are very few cases where hydrogen which inhibits the electrical conductivity is incorporated.

When the carbon film is formed by the sputtering method so that the concentration of the metal element in the carbon film surface is lower than the average concentration thereof in the whole of the carbon film, for example, the following means can be used.

Firstly, a carbon target or graphite target as the carbon supply source; and a metal target composed of each metal element to be included in the carbon film as the metal element supply source are prepared. The metal target may be composed of one metal element or may include two or more kinds of metal elements, depending on the kind of a metal element to be included in the carbon film. A composite target in which at least one kind of carbon and a metal element is mixed so as to be contained in the form of mosaic or in the matrix may be used instead of the above-described metal target. The sputtering is performed by using such a target, and when the sputtering is performed, for example, the concentration of the metal element in the carbon film can be controlled by suitably adjusting input power of the carbon target and metal target. The concentration of the metal element in the carbon film can be freely controlled by the method in which it is rotated so as to move alternately on both of the targets or the like.

Alternatively, the concentration of the metal element in the carbon film can be controlled by subjecting the metal element to be contained in the carbon film to chip-on the carbon target or graphite target, and then, adjusting the number and position of the metal element on the sputtering target as described in the Examples described later, instead of using two or more sputtering targets as described above.

When the concentration of the metal element in the carbon film surface is controlled, specific examples thereof include a method in which a single-layer film of the carbon film containing the metal element is formed, and after the concentration of the metal element in the single-layer film is determined by EPMA (Electron Probe X-ray Micro Analyzer), with regard to the lamination thickness, it is laminated so that the film of the concentration satisfy the desired thickness based on the deposition rate during sputtering.

In the contact probe of the present invention, the predetermined carbon film as described above is included, and other requirements are not particularly limited, and techniques commonly used in the technical field of contact probes can be suitably selected and used. For example, as the base material in the contact probe of the present invention, beryllium-copper (Be—Cu), palladium (Pd), tungsten (W), iridium (Ir) or alloys thereof, carbon tool steels and the like can be suitably used by taking strength or conductivity into consideration. In addition, if needed, the base material may be subjected to plating of Au or the like on the base material.

The present invention can be suitably applied to a socket for test, a probe card, a testing unit and the like, which are used for a semiconductor test, as well as the contact probe. In addition, the base material which covers the carbon film of the present invention is not particularly limited, but tungsten, iridium alloy or the like can be used.

Figure 3:
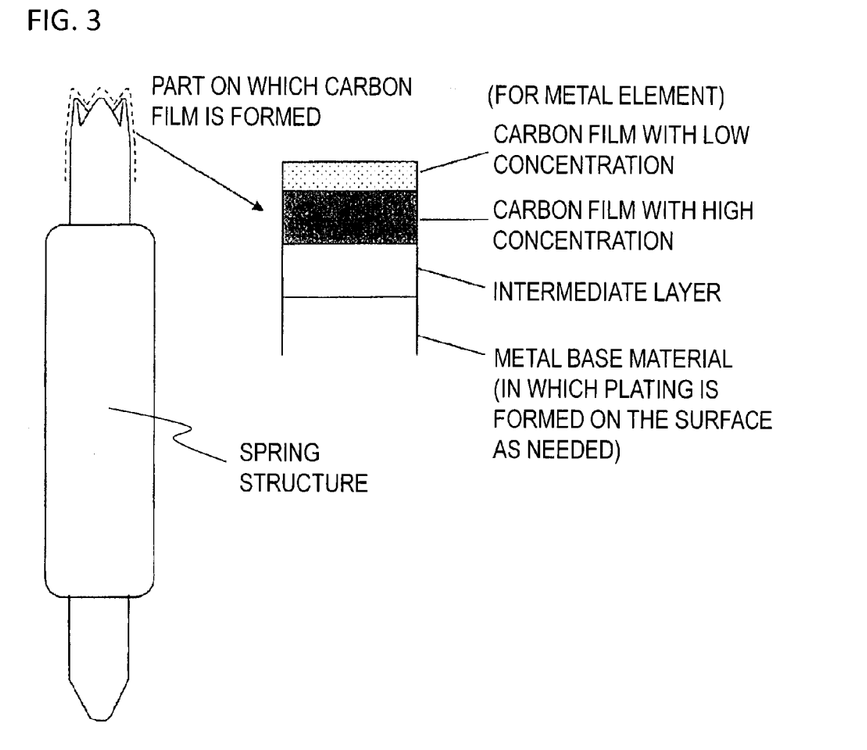
FIG. 3 is a diagram schematically showing the structure of a carbon film and the like included in the contact probe of the present invention.

It is preferred that an intermediate layer for improving the adhesiveness is formed as shown in FIG. 3 between the base material or plating thereon (hereinafter, referred to as "base material or the like") and the carbon film unique to the present invention. The adhesiveness between the base material or the like and the carbon film is originally poor, and this is because the compression stress remains caused by the difference in coefficient of thermal expansion between the carbon film and a metal composed of the base material or the like, and thus, the carbon film is easily peeled at the interface with the base material or the like. As the intermediate layer, known ones may be used, and for example, the intermediate layer described in Patent Document 2 can be referred. Specifically, as the intermediate layer, examples thereof include an intermediate layer including at least one layer or more of a metal-adhesiveness layer including a metal (e.g. Ni or the like) which has good adhesiveness with the base material or an alloy thereof; an intermediate layer in which a carbon-containing layer including a metal (e.g. Ni or the like) of the above metal-adhesiveness layer, a metal element (e.g. W or the like) included in the carbon film and carbon is formed on the above metal-adhesiveness layer; and the like. The carbon-containing layer may be a gradient layer in which the content of the carbon in the carbon-containing layer continues to increase from the base material side to carbon film side.

The metal used in the metal-adhesiveness layer can be suitably selected depending on the kind of the base material or the like, but in the case of using Au-based base material or the like (particularly, plating), Ni or Cu is preferably used, and Ni is more preferably used. The excellent durability can be realized by providing a suitable intermediate layer depending on the base material or the like.

When Pb-free solder or tin is formed on an electrode as an adherend, such plating forms an oxidized insulating film in air, and the contact probe secures satisfactory conduction by deformation and damage to the insulating film during contact with the contact probe. Since a contact probe in which a carbon film is formed on the surface has an increased resistance at the contact interface with the adherend in comparison with a contact probe in which a carbon film is not formed, such a contact probe is easily sensitive to the state of the surface of the adherend. According to the study by the inventors, it was found that when a contact probe was pressed to the adherend with a predetermined load, the degree of damage on the oxidized film largely depends on the curvature radius of the tip of the contact probe. In addition, it was found that the effect of the present invention is effectively and favorably exhibited. That is, when the curvature radius of the tip is 10 μm or less, satisfactory conduction can be obtained regardless of the state of the surface of the adherend, the initial contact resistance decreases, and increase in contact resistance after a certain period of time for performing repetitive tests passes can be suppressed. The curvature radius of the tip is preferably 9 μm or less. In addition, when the tip is too sharp, there is a high possibility that the tip is deformed by a certain load although it depends on the load of contact probe base material or other material(s) (electrode material to be contacted therewith). Thus, the curvature radius is preferably 1 μm or more and more preferably 5 μm or more.

As an article to be used for the test of a semiconductor, electrical element thereof of the like in which a plurality of contact terminals to which the above-described surface treatment has been subjected are combined, examples thereof include a socket for test, a probe card, a testing unit and the like. Since these devices requires the fixation of a plurality of contact probes (terminals) and the simultaneous electrical conduction, the method of the present invention which improves the reliability of the terminal surface is particularly effective for these devices.

EXAMPLES

The present invention will be described more specifically below with reference to examples. It should be noted, however, that the present invention is not restricted in any way by these examples, and it is of course possible to carry out the present invention with appropriate modification within the range conformable to the spirit described above and below. These are all included in the technical scope of the present invention.

Example 1

In this example, a spring built-in probe with a tip part divided into four parts was used as a contact probe. The contact probe (YPW-6XT03-047; manufactured by Yokowo Co., Ltd.) was subjected to Au-based plating on the outermost surface of a Be—Cu base material.

Next, the intermediate layer for improving the adhesiveness with the base material, and the carbon film (containing W as the metal element) were successively formed by the sputtering method as described below.

Specifically, firstly, two carbon (graphite) targets on which W (tungsten) chips were mounted, a chrome target, and a nickel target were arranged in a magnetron sputtering chamber, and the contact probe was arranged in a position opposed thereto. Among them, the chrome target and nickel target are used for the formation of the intermediate layer. After inside of the sputtering chamber was previously evacuated down to $6.7 \times 10^{-4}$ Pa or less, Ar gas was introduced to adjust the pressure to 0.13 Pa.

Next, the intermediate layer was formed on the Au-based plating. Specifically, after 50 nm of Ni and 50 nm of Cr were successively formed, Cr layer and W-containing carbon-containing layer which contains W (tungsten) to be included in the carbon film which would be formed thereafter were alternatively formed above the Cr layer, thereby forming a gradient layer in which the ratio (thickness) of the W-containing carbon-containing layer was gradually increased from the base material side to the carbon film side.

The intermediate layer was formed as described above, and then, the carbon film was formed as described below. The graphite target on which W (tungsten) chips mounted was used, DC magnetron was discharged at an input power density of 5.66 W/cm$^2$, and a bias voltage of −40 V was applied to the base material, thereby forming the carbon film (DLC film) with the thickness of about 500 nm. During the formation, the number and position of the W chips on the graphite target were adjusted so as to control the W concentration in the carbon film (500 nm) to about 24 atomic %.

Successively, the number and position of the W chips on the graphite target were adjusted to form the carbon film with the thickness of about 20 nm in which the W concentration was adjusted to about 5 atomic %, thereby producing the contact probe of the Example of the present invention.

In addition, a contact probe was similarly produced except that the contact probe of the Example of the present invention did not have a carbon film on the outermost surface (that is, which has the W concentration of 5 atomic % in the carbon film with a thickness of 20 nm) (Comparative Example). In addition, the W concentration was measured by an EPMA.

The contact probes (Example and Comparative Example) containing the carbon film obtained as described above were left in air at a temperature of 23° C. and humidity of 50% for two weeks, and a contact resistance value against an electrode composed of Pb-free solder (Sn—3% Ag—0.5% Cu) was measured. The measurement of the contact resistance value was performed by the so-called Kelvin connection in which two lines were connected to the Pb-free solder electrode, two lines were connected to an Au electrode contacting with the opposite side of the contact probe, current was applied to each one of lines, and voltage between the remaining other lines was measured, thereby measuring resistance of the contact probe itself+contact resistance thereof with upper and lower electrodes+internal resistance of the upper and lower electrodes, and other resistance components were measured by a cancellable method.

As a result, the measured contact resistance value (resistance of probe itself+contact resistance+internal resistance of electrodes) was about 150 mΩ in the contact probe in the Example of the present invention, and it was about 500 mΩ in the contact probe in the Comparative Example. On the contrary, the contact resistance value of the contact probe in the Example of the present invention before being left for two weeks was 50 mΩ, and the resistance value of the contact probe in the Comparative Example was 35 mΩ. In other words, in the Comparative Example in which the W concentration in the surface of the contact probe was 24 atomic %, the contact resistance value increased by 500 mΩ−35 mΩ=465 mΩ, but in the Example of the present invention in which the W concentration in the surface thereof was 5 atomic %, the increase of the contact resistance value could be suppressed to about 150 mΩ−50 mΩ=100 mΩ. Furthermore, in the resistance value, since the internal resistance of the electrodes is negligible small, and the resistance of the probe itself does not change, the amount of change in resistance value before and after being left is equal to the amount of change in contact resistance value.

In addition, since the average concentration of W in the whole of the carbon film of the contact probe in the Example of the present invention is {(20 nm×5 atomic %)+(500 nm×24 atomic %)}/(20 nm+500 nm)=about 23.3 atomic % and the W concentration in the whole of the carbon film was sufficiently secured, the initial conductivity could also be sufficiently secured.

Example 2

Figure 4:
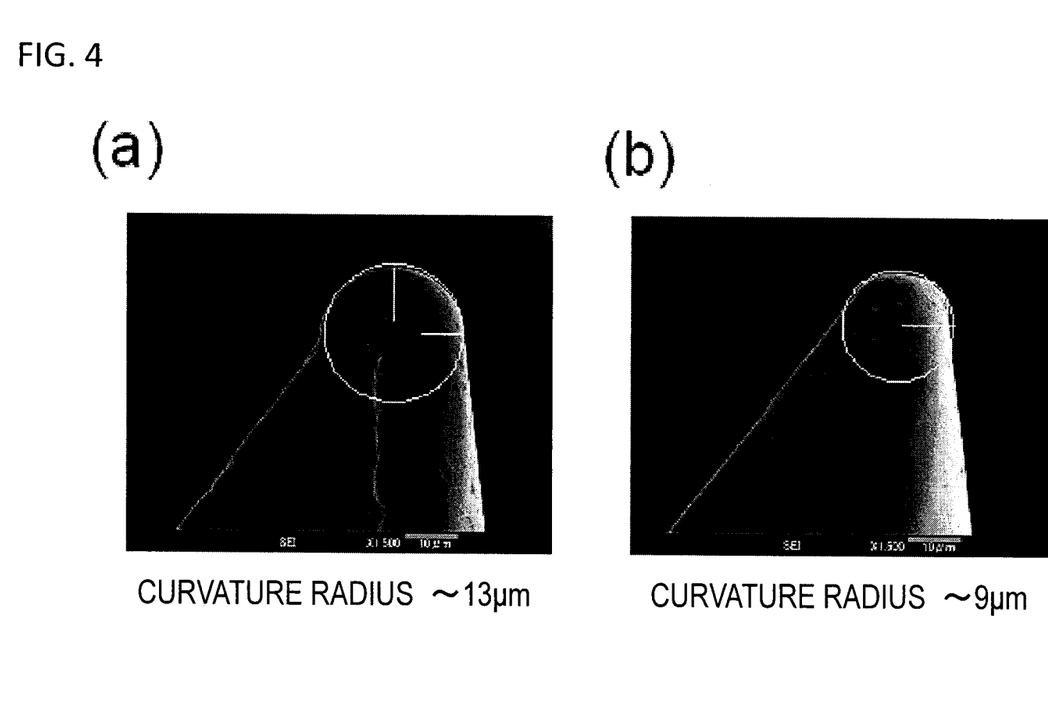

FIGS. 4(*a*) and (*b*) shows the photograph when the protruding part of the tip of the contact probe in the above Example 1 is projected from the side surface, and the radius of the circle which inscribes the tip peripheral part (the curvature radius of the tip part) was about 13 μm (FIG. 4(*a*)). In this Example, except for the fact that the curvature radius of the tip part was 9 μm, the film was formed on the contact probe in the same manner as in Example 1 (FIG. 4(*b*)), and the contact probe was left for two weeks under the same condition as in Example 1 to measure the contact resistance value before and after the contact probe was left. As a result, the contact resistance value before being left was about 45 mΩ, and the value thereof after being left was about 100 mΩ. In other words, by appropriately adjusting the tip shape of the contact probe, the initial contact resistance value could be lowered and the increase of the contact resistance value after a certain period of time passes could also be suppressed to be low (in other words, the rate of increase of the contact resistance could be suppressed). As shown in FIG. 1, even though the increase of the contact resistance per unit area was constant, the increase of the contact resistance in this Example was suppressed to be low. It is considered that this is because an effective contact area has changed, thereby suppressing the increase of the contact resistance to be low according to the area.

Example 3

In this Example, by using the contact probe of the Example of the present invention used in Example 1 and a contact probe before being formed with the carbon film in Example 1 in which the outermost surface was subjected to Au-based plating (YPW-6XT03-047), adherence and non-adherence of Sn of a Pb-free solder electrode as other material was examined. Each of the contact probes was brought into contact with the Pb-free solder electrode 100,000 times, and current of 100 mA was applied for 200 ms for every one contact. After contact 100,000 times, the surface of each probe was observed with the SEM, and element analysis (mapping) was performed with an EDX device accompanying thereto.

According to the results of element analysis, it was found that the adherence of Sn was suppressed in the contact probe of the present invention in which the carbon film was formed, while the adherence of Sn that is a component of the Pb-free solder to the surface of the contact probe was confirmed in the contact probe in which the outermost surface was Au.

Example 4

In this Example, the contact resistance value was measured in the case where the carbon film containing W in the surface layer and W and Cr in the area other than the surface layer was formed.

In detail, the intermediate layer was formed in the same manner as the Example 1, and then, a graphite target on which W (tungsten) chips and Cr chips were mounted was used, DC magnetron was discharged at an input power density of 5.66 W/cm$^2$, and a bias voltage of −40 V was applied to the base material, thereby forming the carbon film (DLC film) with the thickness of about 500 nm. During the formation, the number and position of the W chips and Cr chips on the graphite target were adjusted so as to control, in the carbon film (500 nm), the Cr concentration to about 50 atomic %, and the concentration of the total of W and carbon (C) to 50 atomic % (specifically, the W concentration was controlled to about 7 atomic % and the carbon concentration was controlled to about 43 atomic %).

Successively, the number and position of the W chips on the graphite target were adjusted to form the carbon film with the thickness of about 20 nm in which the W concentration was adjusted to about 14 atomic %, thereby producing the contact probe of the present invention.

Next, the contact probes (Example and Comparative Example) containing the carbon film obtained as described above were used, and the air exposure test was conducted for two weeks in the same manner as the Example 1, and the measurement of the contact resistance before and after test was performed.

As a result, in this Example, the contact resistance value after being left for two weeks was 350 mΩ, and the contact resistance value before being left for two weeks was 30 mΩ, and the contact resistance value increased by 350 mΩ−30 mΩ=about 320 mΩ. The increase of the contact resistance value is larger than the increase level (about 100 mΩ) of the contact resistance value in the Example of the present invention prepared in the Example 1, but is much smaller than the increase level (465 mΩ) of the contact resistance value in the Comparative Example prepared in the Example 1.

In addition, in the contact probe of this Example, since the average concentration of the metal elements (W+Cr) in the whole of the carbon film is {(20 nm×14 atomic %)+(500 nm×(50 atomic %+7 atomic %)}/(20 nm+500 nm)=about 53.3 atomic % and the concentration of the metal elements in the whole of the carbon film was sufficiently secured, the initial conductivity could also be sufficiently secured.

Thus, it was confirmed, by using not only the contact probe containing the metal element singularly in the carbon film surface as in the Example of the present invention as described in the Example 1, but also the contact probe containing the different metal elements in the area of the carbon film surface and the area other than the surface and containing two kinds or more of the metal elements in the area other than the surface, as in the Example of the present invention as described in this Example, the deterioration of the conductivity due to the oxidation of the metal element could be inhibited, and both of the conductivity of the contact probe and low adhesion property to an adherend could be realized.

While the present invention has been described in detail and with reference to specific embodiments thereof, it will be apparent to one skilled in the art that various changes and modifications can be made therein without departing from the spirit and scope thereof.

This application is based on Japanese Patent Application No. 2010-108504 filed on May 10, 2010 and Japanese Patent Application No. 2011-104394 filed on May 9, 2011, the entire subject matters of which are incorporated herein by reference.

INDUSTRIAL APPLICABILITY

With regard to the concentration of a metal element in a carbon film formed on the surface of a contact probe contacting with an electrode, since the concentration in the film surface is lower than the average concentration thereof, a contact probe of the present invention can prevent deterioration of conductivity resulting from oxidization of the metal element. Furthermore, by securing the average concentration in the whole of the film to a predetermined level or higher, both of the conductivity of the contact probe and low adhesion property of the contact probe to an adherend (particularly, Sn included in the adherend) can be realized.

The invention claimed is:

1. A contact probe comprising:
a base material;
a carbon film provided on a tip of the contact probe and configured to contact with an electrode, the carbon film comprising a metal element; and
an intermediate layer provided between the carbon film and the base material,
wherein a concentration of the metal element in the carbon film surface is lower than an average concentration of the metal element in a whole of the carbon film, and
wherein the carbon film further comprises: a plurality of layers, each of the plurality of layers having a uniform concentration of the metal element along a direction of a thickness of the carbon film, or having a concentration which is continuously changed along the direction of the thickness of the carbon film.

2. The contact probe according to claim 1, wherein the concentration of the metal element in the carbon film is decreased from the intermediate layer toward the surface of the contact probe.

3. The contact probe according to claim 1, wherein the concentration of the metal element in the carbon film surface is 15 atomic % or less.

4. The contact probe according to claim 1, wherein a difference between the concentration of the metal element in the carbon film surface and the average concentration of the metal element in the whole of the carbon film is 10 atomic % or more.

5. The contact probe according to claim 1, wherein the average concentration of the metal element in the whole of the carbon film is more than 15 atomic %.

6. The contact probe according to claim 1, wherein the carbon film is a diamond-like carbon film.

7. The contact probe according to claim 1, wherein the metal element is at least one kind selected from the group consisting of tungsten, tantalum, molybdenum, niobium, titanium and chromium.

8. The contact probe according to claim 1, wherein a total thickness of the carbon film is 50 nm or more and 5 μm or less.

9. The contact probe according to claim 1, wherein a projection is formed at the tip of the contact probe, and when a tip of the projection is projected from a side surface of the contact probe, a radius of curvature thereof is 10 μm or less.

10. A connection device for test, comprising: a plurality of contact probes, wherein the plurality of contact probes comprise the contact probe according to claim 1.

11. The contact probe according to claim 1, wherein the carbon film has a surface portion which extends from a surface of the contact probe to a depth of 1 nm, a concentration of the metal element in the surface portion is lower than an average concentration of the metal element in a whole of the carbon film.

12. The contact probe according to claim 1, wherein the carbon film has a surface portion which extends from a surface of the contact probe to a depth of 5 nm, a concentration of the metal element in the surface portion is lower than an average concentration of the metal element in a whole of the carbon film.

13. The contact probe according to claim 1, wherein the base material is made of beryllium-copper (Be—Cu), palladium (Pd), tungsten (W), iridium (Ir) or an alloy thereof.

* * * * *